US012666057B2

(12) United States Patent
Marcu et al.

(10) Patent No.: US 12,666,057 B2
(45) Date of Patent: Jun. 23, 2026

(54) MOTION VECTOR DETERMINATION WITH CMOS

(71) Applicant: Sandisk Technologies, Inc., Milpitas, CA (US)

(72) Inventors: Alon Marcu, Tel-Mond (IL); Ofir Pele, Netanya (IL); Ariel Navon, Revava (IL); Shay Benisty, Beer Sheva (IL); Karin Inbar, Ramat Hasharon (IL); Judah Gamliel Hahn, Ofra (IL)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/104,176

(22) Filed: Jan. 31, 2023

(65) Prior Publication Data

US 2023/0179777 A1     Jun. 8, 2023

Related U.S. Application Data

(62) Division of application No. 17/349,515, filed on Jun. 16, 2021, now Pat. No. 11,601,656.

(51) Int. Cl.
| | |
|---|---|
| *H04N 19/176* | (2014.01) |
| *G11C 16/04* | (2006.01) |

(Continued)

(52) U.S. Cl.
CPC ....... *H04N 19/176* (2014.11); *G11C 16/0483* (2013.01); *H04N 19/103* (2014.11);

(Continued)

(58) Field of Classification Search
CPC .. H04N 19/176; H04N 19/103; H04N 19/159; H04N 19/513; H04N 19/52; H04N 19/58; G11C 16/0483
See application file for complete search history.

(56) References Cited

U.S. PATENT DOCUMENTS

| | | | | | |
|---|---|---|---|---|---|
| 5,400,087 | A | * | 3/1995 | Uramoto .............. | H04N 19/523 |
| | | | | | 375/E7.113 |
| 6,166,979 | A | * | 12/2000 | Miyamoto .......... | G11C 11/5621 |
| | | | | | 365/219 |

(Continued)

OTHER PUBLICATIONS

Suvojit Acharjee et al., Motion Vector Estimation Using Parallel Processing, IEEE Xplore, Mar. 12, 2015, 6 pages.

(Continued)

*Primary Examiner* — Richard T Torrente
(74) *Attorney, Agent, or Firm* — Patterson + Sheridan, LLP

(57) ABSTRACT

A method and apparatus for video processing on a data storage device. A chip bound architecture includes a CMOS coupled to one or more NAND die, the CMOS including one or more processors, memories, and error correction code (ECC) engines capable of processing video data. According to certain embodiments, macroblocks are correlated between two I-frames, including motion vectors to define different locations of correlated macroblocks. A P-frame may be determined from a previous I-frame and its correlated macroblocks and motion vectors, while a B-frame may be determined from two or more adjacent I-frames with concomitant macroblocks and motion vectors, as well as P-frames associated with an adjacent I-frame.

6 Claims, 6 Drawing Sheets

(51) Int. Cl.
  *H04N 19/103*          (2014.01)
  *H04N 19/159*          (2014.01)
  *H04N 19/513*          (2014.01)
  *H04N 19/52*           (2014.01)
  *H04N 19/58*           (2014.01)
  *G06F 9/30*            (2018.01)

(52) U.S. Cl.
  CPC ......... *H04N 19/159* (2014.11); *H04N 19/513* (2014.11); *H04N 19/52* (2014.11); *H04N 19/58* (2014.11); *G06F 9/30032* (2013.01); *G06F 9/30036* (2013.01)

(56)                References Cited

U.S. PATENT DOCUMENTS

| | | | |
|---|---|---|---|
| 7,167,890 | B2 | 1/2007 | Lin et al. |
| 7,733,960 | B2* | 6/2010 | Kondo ................. H04N 19/583 |
| | | | 375/240.16 |
| 10,694,178 | B2 | 6/2020 | Jun |
| 10,841,645 | B1 | 11/2020 | Muthiah |
| 2001/0014051 | A1 | 8/2001 | Watanabe et al. |
| 2003/0123748 | A1* | 7/2003 | Sebot ................... G06F 17/147 |
| | | | 712/E9.034 |
| 2008/0205858 | A1 | 8/2008 | Lee et al. |
| 2009/0074072 | A1 | 3/2009 | Endo |
| 2010/0195922 | A1* | 8/2010 | Amano ................ H04N 19/176 |
| | | | 382/233 |
| 2012/0260145 | A1* | 10/2012 | Yang ................. H03M 13/6312 |
| | | | 714/752 |
| 2017/0160953 | A1 | 6/2017 | Hirata |
| 2018/0088941 | A1* | 3/2018 | Pardo ....................... G06F 9/38 |
| 2019/0200039 | A1* | 6/2019 | Tanner ................ H04N 19/105 |
| 2020/0195953 | A1 | 6/2020 | Lainema |

OTHER PUBLICATIONS

Jung-Yup Kang, et al., An Efficient Data-Distribution Mechanism in a Processor-In-Memory (PIM) Architecture Applied to Motion Estimation, IEEE Transactions on Computers, vol. 57, No. 3, Mar. 2008, 14 pages.
Jeffrey Draper, et al., A Prototype Processing-In=Memory (PIM) Chip for the Data-Intensive Architecture (DIVA) System, Journal of VLSI Signal Processing 40, 73-84, 2005, 12 pages.
Wikipedia, Inter frame, https://en.wikipedia.org/wiki/Inter_frame, Aug. 18, 2020, 9 pages.

* cited by examiner

CMOS 306

ARRAY 308

ARRAY 308

300

600

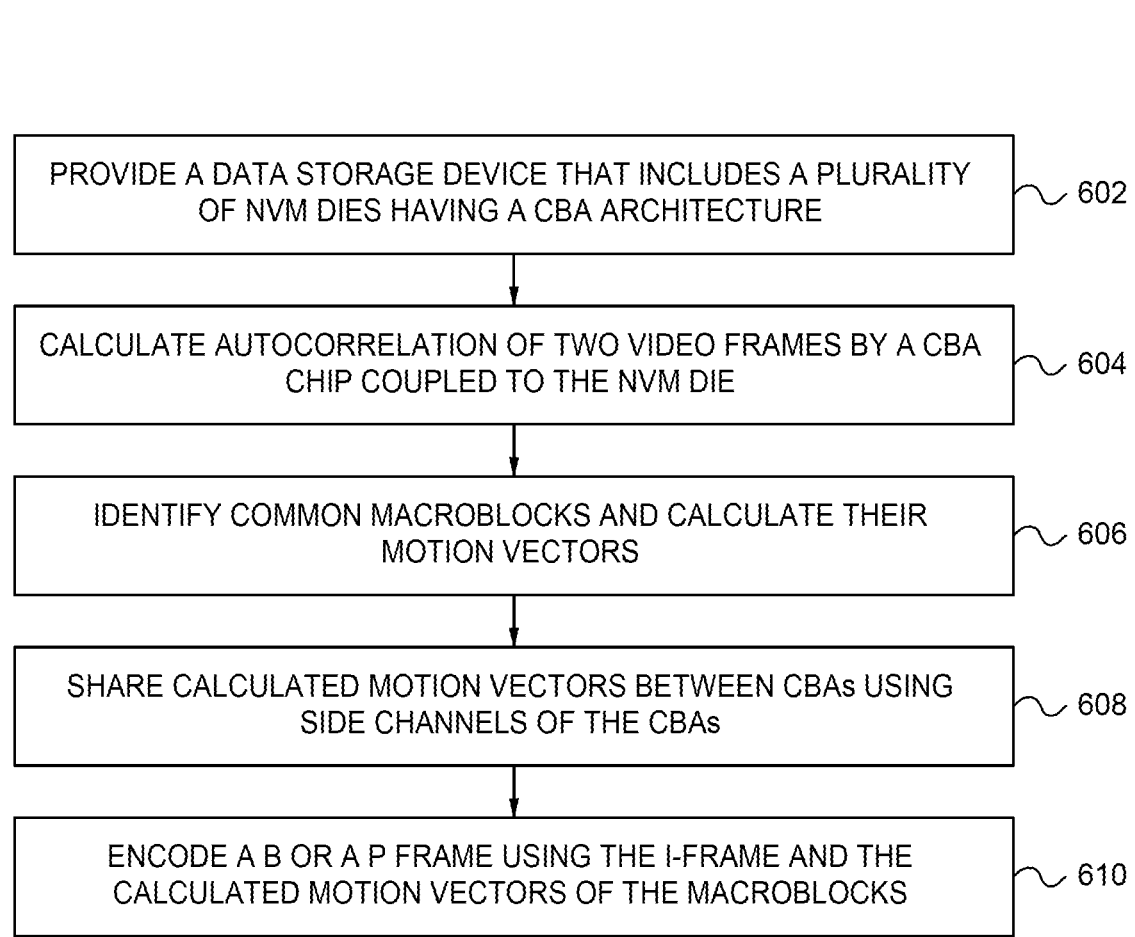

PROVIDE A DATA STORAGE DEVICE THAT INCLUDES A PLURALITY OF NVM DIES HAVING A CBA ARCHITECTURE ~ 602

CALCULATE AUTOCORRELATION OF TWO VIDEO FRAMES BY A CBA CHIP COUPLED TO THE NVM DIE ~ 604

IDENTIFY COMMON MACROBLOCKS AND CALCULATE THEIR MOTION VECTORS ~ 606

SHARE CALCULATED MOTION VECTORS BETWEEN CBAs USING SIDE CHANNELS OF THE CBAs ~ 608

ENCODE A B OR A P FRAME USING THE I-FRAME AND THE CALCULATED MOTION VECTORS OF THE MACROBLOCKS ~ 610

FIG. 6

MOTION VECTOR DETERMINATION WITH CMOS

CROSS-REFERENCE TO RELATED APPLICATIONS

This application is a divisional of co-pending U.S. patent application Ser. No. 17/349,515, filed Jun. 16, 2021, which is herein incorporated by reference.

BACKGROUND OF THE DISCLOSURE

Field of the Disclosure

Embodiments of the present disclosure generally relate to a data storage device, and more particularly, to a data storage device capable of video processing.

Description of the Related Art

As generating a frame of video data from raw frame data is a computationally expensive process, a subset of video frames are calculated from pixel data, known as I-frames, representing period frames throughout a video. Portions of I-frames, macroblocks, may be correlated as between I-frames with different locations of correlated macroblocks in different I-frames defined by motion vectors. To deliver a smooth video experience, intermediate frames known as B-frames and P-frames, between two I-frames may be generated using data from the I-frames, correlated macroblocks, and motion vectors.

Processing to generate a series of contiguous frames of video are conventionally carried out by a host retrieving I-frames, macroblocks, and motion vectors from a data storage device to generate intermediate frames. Computation of intermediate frames is typically accomplished on a host processor, such as a system CPU or one or more video card processors.

Although the needed video data is stored on the data storage device, video processing such as described above conventionally is not carried out on the data storage device, usage of host resources such as memory and processors, in addition to requiring data transport of frame data from the data storage device to a processing destination.

What is needed are systems and methods for overcoming deficiencies of prior approaches.

SUMMARY OF THE DISCLOSURE

The present disclosure generally to systems and methods for video processing on a data storage device. A chip bound architecture includes a CMOS coupled to one or more NAND die, the CMOS including one or more processors, memories, and error correction code (ECC) engines capable of processing video data. According to certain embodiments, macroblocks are correlated between two I-frames, including motion vectors to define different location of correlated macroblocks. A P-frame may be determined from a previous I-frame and its correlated macroblocks and motion vectors, while a B-frame may be determined from two or more adjacent I-frames with concomitant macroblocks and motion vectors, as well as P-frames associated with an adjacent I-frame.

In one embodiment, a solid state drive is disclosed that includes a memory device, a first CMOS coupled to the memory device, and a controller coupled to the memory device configured to execute computer-readable instructions. When executed, the computer-readable instructions cause the controller to receive at least a portion of one of a first I-frame comprising a first macroblock and second I-frame comprising a second macroblock, on the memory device and correlate a first macroblock to the second macroblock. The computer-readable instructions further cause the controller to determine a first motion vector of the first macroblock and a second motion vector of the second macroblock, and encode a P-frame based on one of the first I-frame and the first motion vector.

In another embodiment, a controller for a data storage device is disclosed that includes a memory comprising computer-readable instructions, and a processor configured to execute the computer-readable instructions that will cause the processor to store a portion of a first I-frame comprising a first macroblock on a jumbo block spanning multiple NAND dies, determine a motion vector of the first macroblock, and encode a P-frame based on the first I-frame and the first macroblock.

In another embodiment, a data storage device is disclosed that includes a memory means configured to execute a method for video processing. The method includes receiving a first I-frame and a second I-frame at a plurality of CMOS CbAs, correlating the first I-frame and second I-frame to identify a first macroblock associated with the first I-frame and second macroblock associated with the second I-frame, the first macroblock correlated to the second macroblock, and calculating a first motion vector of the first macroblock and a second motion vector of the second macroblock.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6 is a schematic flow diagram illustrating a method of video processing with multiple circuit chip architectures, according to certain embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure relates to systems and methods for video processing on a data storage device. A chip bound architecture includes a CMOS coupled to one or more NAND die, the CMOS including one or more processors, memories, and error correction code (ECC) engines capable of processing video data. According to certain embodiments, macroblocks are correlated between two I-frames, including motion vectors to define different location of correlated macroblocks. A P-frame may be determined from a previous I-frame and its correlated macroblocks and motion vectors, while a B-frame may be determined from two or more adjacent I-frames with concomitant macroblocks and motion vectors, as well as P-frames associated with an adjacent I-frame.

Figure 1:
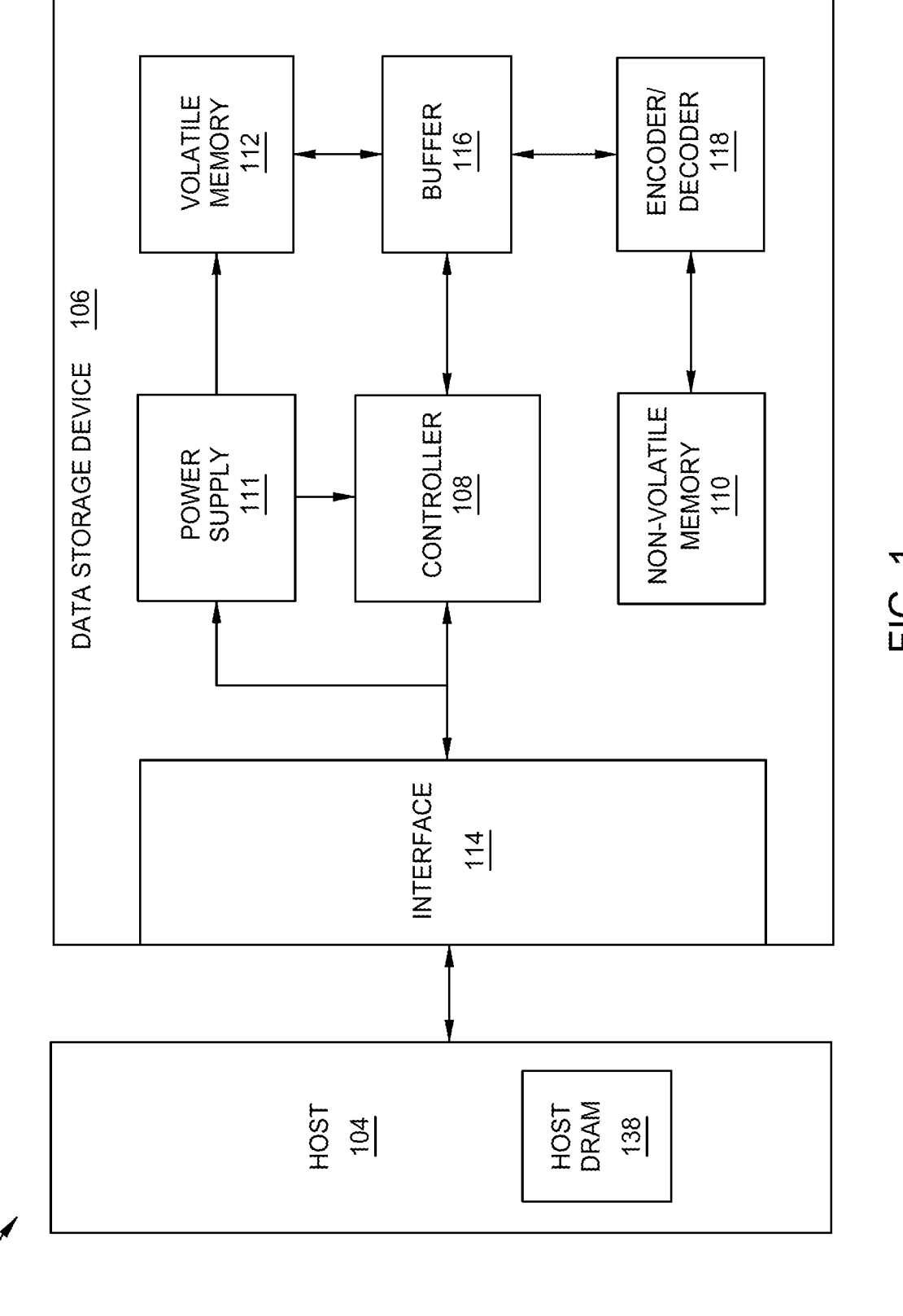
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The data storage device further includes an encoder/decoder 118. The encoder/decoder 118 is coupled to the buffer 116 and the NVM 110, such that data is encoded prior to being programmed to the NVM 110 and decoded after the data is read from the NVM 110, but before being returned to the controller 108. It is to be understood that the encoder/decoder 118 may be separate components of the data storage device 106.

Figures 2A, 2B:
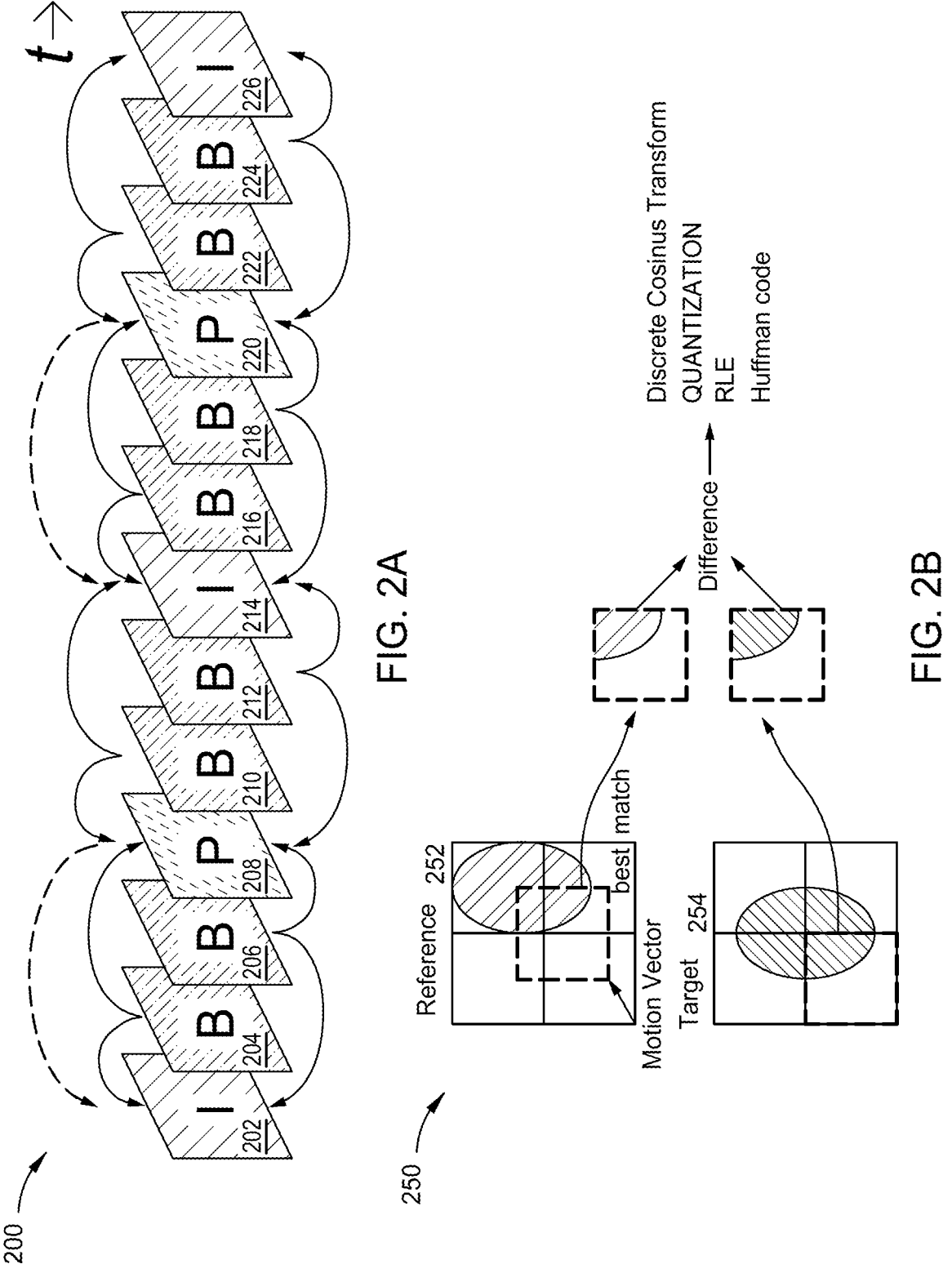
FIG. 2A is a schematic illustration of dependencies of a group of pictures of a video frame, according to certain embodiments.
FIG. 2B is a schematic illustration of an inter-frame prediction process, according to certain embodiments.

FIG. 2A is a schematic illustration of dependencies of a plurality of pictures 202-226 of a video frame 200, according to certain embodiments. The video frame 200 may be received by a host device, such as the host device 104 of FIG. 1. Each picture of the plurality of pictures 202-226 is either an I-frame, a B-frame, or a P-frame. I-frames include an entire image and are coded without reference to any other frame. In one embodiment, I-frames may be programmed in SLC since I-frames may be accessed more frequently than B-frames and P-frames.

P-frames use previous frames to be decoded and may include image data, motion vector displacements, and combinations thereof. P-frames predict the current frame from an earlier picture, such as an I-frame or a B-frame. B-frames use previous and future frames for decoding of the B-frame, such that B-frames are bi-directionally predicted frames. For example, in the video frame 200, a first picture 202 (I-frame) is used to predict or encode a fourth picture 208 (P-frame). The first picture 202 and the fourth picture 208 are used to predict or encode a second picture 204 (B-frame) and a third picture 206 (B-frame). In some embodiments, each picture of the plurality of pictures 202-226 is stored on separate, but adjacent memory dies. For example, the first picture 202 is stored on die0, the second picture 204 is stored on die1, the third picture 206 is stored on die2, and so on.

FIG. 2B is a schematic illustration of an inter-frame prediction process 250, according to certain embodiments. The video frames are divided into macroblocks. When encoding the macroblocks, the encoder may determine if there is a block similar to the currently encoded block on a previously encoded frame. Because adjacent frames in a video frame, such as the video frame 200, are typically similar, motion vectors are used to point to the position of the matching block from the reference frame. For example, in FIG. 2A, the first picture 202 is used to predict the fourth picture 208, where the first picture 202 and the fourth picture 208 are similar. In reference frame 252, a motion vector points to the best match with regards to the target macroblock of the target frame 254. Although the reference macroblock found may not be an exact match to the target macroblock, an encoder computes differences between them using at least one of Discrete Cosinus Transform, Quantization, RLE, and Huffman code. Therefore, when decoding the encoded frame, the decoder is able to determine the raw pixels of the macroblock.

A macroblock of the target frame 254 is correlated to a macroblock of the reference frame 252. Although the macroblock of the target frame 254 may not be identical to the reference frame 252, the calculated motion vectors are used to shift the reference frame 252 to match the target frame 254. The encoding of a P-frame and a B-frame may utilize the calculated motion vectors and the target frame 254, where the target frame 254 is an I-frame.

Figure 3:
FIG. 3 is a schematic illustration of a Circuit Bounded Array (CbA) architecture, according to certain embodiments.

FIG. 3 is a schematic illustration of a Circuit Bounded Array (CbA) architecture 300, according to one embodiment. The CbA architecture 300 includes one or more complementary metal oxide semiconductor (CMOS) chips 306 coupled to respective one or more memory arrays 308 via one or more connection units. In one embodiment, each memory array 308 comprises a memory die. The CMOS chips 306 may include an encoder unit and a decoder unit as well as similar processing logic as a controller, such as the controller 108. The CMOS chips 306 may further include an error correction code (ECC) engine, which may be part of the encoder unit and the decoder unit. The CMOS chips 306 may be configured to schedule received write commands to program data to the coupled memory die, and schedule received read commands to read data from the coupled memory die. It is to be understood that that NAND dies may be referred to as memory dies for exemplary purposes.

In the description herein, it is to be understood that CMOS chips and CbA may be used interchangeably for exemplary purposes, and embodiments described herein may also be applicable to CMOS Under Array (CuA) architectures and CMOS Above Array (CAA) architectures.

Figure 4:
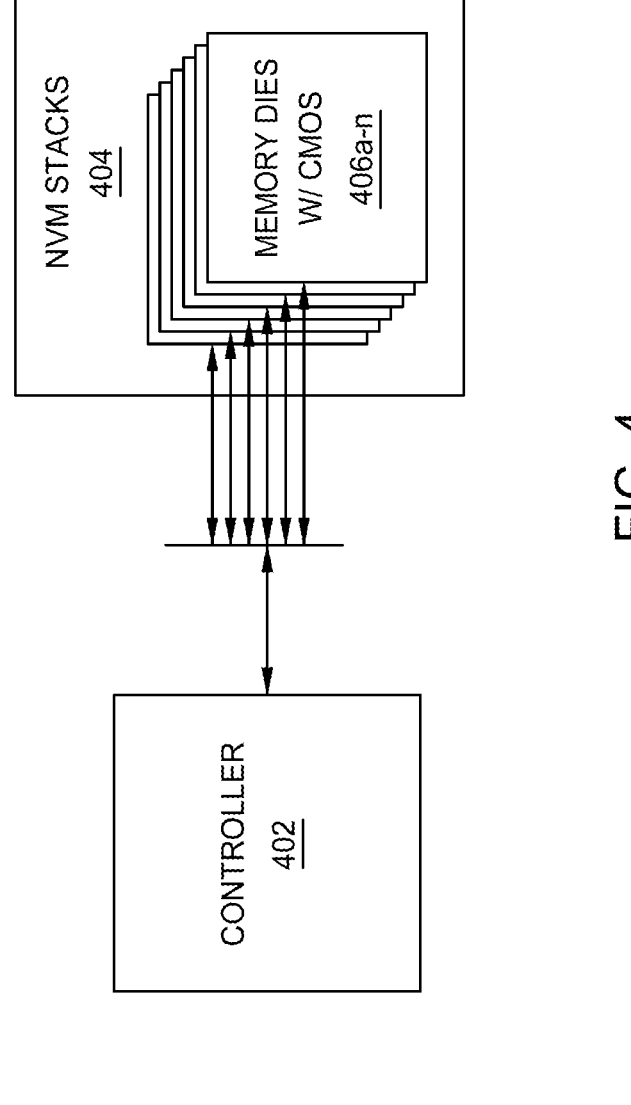
FIG. 4 is a schematic block diagram illustrating a controller managing a plurality of memory dies each including a CMOS chip of an NVM, according to certain embodiments.

FIG. 4 is a schematic block diagram 400 illustrating a controller 402 managing a plurality of memory dies 406a-n each, including a CMOS chip of an NVM stack 404, according to certain embodiments. The NVM stack 404 may be the NVM 110 of FIG. 1. The controller 402 may be a controller of a host device, such as the host device 104 of FIG. 1, or a controller of the data storage device, such as the controller 108 of FIG. 1. The controller 402 manages the video processing multi-CbA, such as the CbA architecture 300, in the memory compute system. Each CMOS chip, such as the CMOS chip 306 of FIG. 3, of each memory die of the plurality of memory dies 406a-n are configured to handle the computational tasks, such as determining the motion vectors between frames. The controller 402 may handle the video processing, such as the encoding and decoding of the B-frames and the P-frames.

I-frames, B-frames, and P-frames may be processed in parallel in-memory, in each CbA (e.g., the plurality of CMOS chips 306). Furthermore, because I-frames, B-frames, and P-frames may be atomically processed on a single memory die, a minimal amount of transfers of results between dies may occur. Furthermore, the autocorrelation calculation of a B-frame and a P-frame of each die may be completed in parallel by each respective CbA using motion vectors of adjacent frames. Motion vectors have a size less than the size of a frame, such that CbA side channels may handle the transfer of motion vectors between CbAs.

The CbA to CbA side channels may allow for reducing duplicated calculations performed by the data storage device. For example, the autocorrelation calculation between two frames on two dies may be split between two CbAs. By splitting the autocorrelation calculation between two CbAs, the computation effort may be reduced by about 50%. Furthermore, the calculated motion vectors of macroblocks of adjacent memory dies or relatively close memory dies may be used to calculate the macroblocks of the next memory dies. The macroblocks of video frames that have a high count value (i.e., used more often) may be distributed via the side channels of the CbAs so that adjacent CbAs may use the more commonly used macroblocks in the computation of the autocorrelation calculations.

Figure 5:
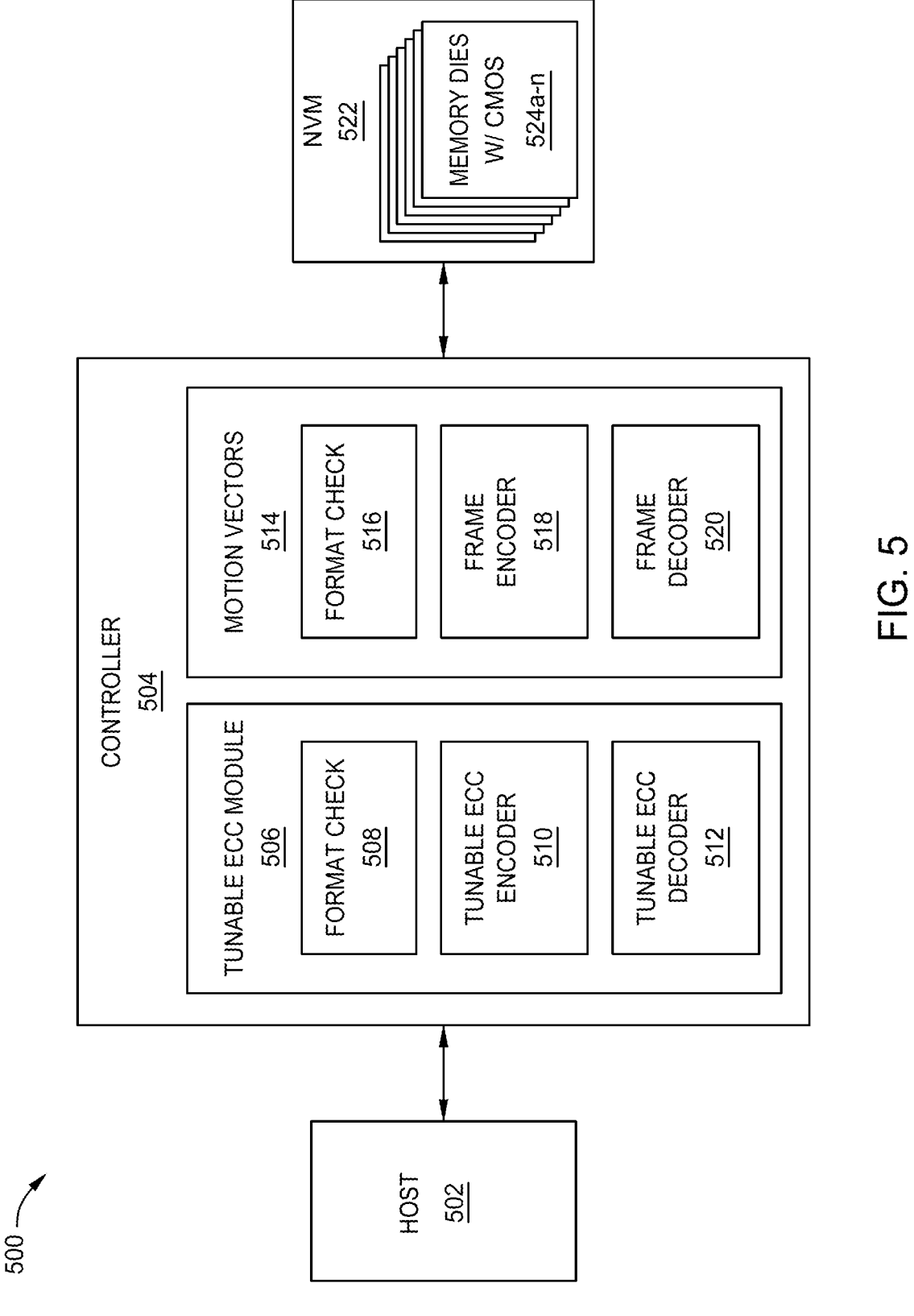
FIG. 5 is a schematic block diagram illustrating a storage system in which a controller is configured to encode and decode a video frame, according to certain embodiments.

FIG. 5 is a schematic block diagram illustrating a storage system 500 in which a controller 504 is configured to encode and decode a video frame according to certain embodiments. A host device 502, such as the host device 104 of FIG. 1, is coupled indirectly to the controller 504. The host device 502 sends data, such as a video, to controller 504. The controller 504 includes a tunable ECC module 506 and a motion vectors unit 514. The controller 504 is coupled to the NVM 522, where the NVM 522 includes a plurality of memory dies with CMOS chips 524a-n. In some examples, the controller 504 divides the tasks of frame encoding between the plurality of memory dies 406a-n and the associated CbAs. Furthermore, controller 402 may tune the error correction code (ECC) code rate per frame, per die, and/or per CbA according to the frame type (e.g., I-frame, P-frame, and B-frame).

The tunable ECC module 506 includes a format check 508, a tunable ECC encoder 510, and a tunable ECC decoder 512. The format check 508 may determine the format of the video frame, such that the picture frame is associated with a frame type. Based on the format of the video frame, the tunable ECC encoder 510 may determine an amount of ECC data to encode the video frame with. For example, if the format of the video frame is an I-frame, then the video frame may be programmed with a greater amount of ECC data than that of a B-frame or a P-frame. For example, the ECC parity protection of I-frames may be increased while reducing the code rate since the data of an I-frame is more significant with higher replication rates when compared to other dependent frames. Code rates may be increased to allow for decreased ECC data protection and decreased for increased ECC data protection. The amount of ECC data protection may be based on the usage of the relevant data or the number of copies stored of the relevant data. B-frames and P-frames may have regular or even reduced ECC protection since the replication rate of B-frames and P-frames are low. Alternatively, in a system that stores duplicate I-frames across multiple dies, the other copies of the same I-frame may be used to recover failures when reading an I-frame on a specific die. Thus, the ECC data may be reduced on I-frames due to the storage of duplicate I-frames.

In one embodiment, the tunable ECC encoder 510 may be tuned according to the calculated motion vector sizes of the macroblocks and the predicted error information, such that macroblocks with small motion vector values have a smaller number of ECC data and macroblocks with high motion vector vales have a larger number of parity bits. In another embodiment, the number of usages for macroblocks with small motion values may be collected, and more ECC data may be generated for the macroblocks that have a high usage number. Because macroblocks with small motion values may be used more often, more ECC data may be required since there may be a large dependency on the macro blocks with the small motion values. Furthermore, the tunable ECC decoder 512 may be configured to decode the received encoded data from the plurality of memory dies 524a-n.

The motion vectors unit 514 includes a format check 516, a frame encoder 518, and a frame decoder 520. Because video encoding of B-Frames and P-frames may require a large amount of bandwidth, such that the encoding is a large computational task, duplicate I-frames may be stored on separate memory dies. Therefore, the B-Frames and the P-frames of multiple dies may be encoded and decoded in parallel using the relevant CMOS chips and the relevant duplicate I-frame.

The format check 516 may be similar to the format check 508. The frame encoder 518 encodes the video frame to be stored to the NVM 522 and the frame decoder 520 decodes the video frame retrieved from the NVM 522. The frame encoder 518 may encode a calculated or determined motion vector in the video frame, where the motion vector is calculated based on an adjacent or nearby macroblock.

In one embodiment, each die of the plurality of dies 524a-n receives a full frame to process (using the relevant CMOS chip). The processed frame and the related I-frame are located on the memory die. In another embodiment, two frames may be split between multiple dies of the plurality of dies 524*a-n* as part of a jumboblock. A jumboblock is a logical grouping of blocks. The controller 504 is configured to organize the data of the jumboblocks, such that an autocorrelation calculation data is available in each die, and data transfers between dies and CbAs are minimized. For example, upon detecting that an I-frame resides in LBA ranges that span multiple dies as part of a jumboblock, the controller 504 may duplicate information in each die or reorder data such that the physical location of the I-frame is optimally placed in a die so that multiple dies may access the I-frame concurrently. In yet another embodiment, the controller 504 program macroblocks fully in a single die in order to enable easier correlation calculation.

FIG. 6 is a schematic flow diagram illustrating a method 600 of video processing with multiple circuit chip architectures, according to certain embodiments. For exemplary purposes, the method 600 may be executed by the controller 504 of FIG. 5 or the controller 402 of FIG. 4. At block 602, a data storage device, such as the data storage device 106 of FIG. 1, is provided. The data storage device includes a plurality of NVM dies have a CbA architecture, such as the plurality of memory dies 406*a-n* each including a CMOS chip of FIG. 4. At block 604, the controller calculated an autocorrelation of two video frames using the CbA chip coupled to an NVM die. For example, the autocorrelation may include determining a similarity between the two video frames.

At block 606, the controller identifies common macroblocks and calculates their motion vectors. The motion vectors may be calculated by a CbA. For example, a first CbA may determine a first motion vector for a first macroblock and a second CbA may determine a second motion vector for a second macroblock. The identification and the calculation may be the inter-frame prediction process 250 of FIG. 2B. For example, the identification may include determining that a reference macroblock matches a target macroblock. After determining that a reference macroblock matches a target macroblock, the calculation is completed to determine a shift position between the reference macroblock and the target macroblock based on the motion vectors of each of the macroblocks.

At block 608, the calculated motion vectors are shared between the CbAs using the side channels of the CbAs in order to aid and speed up other calculations using a common reference macroblock or video frame, such as an I-frame. At block 610, a B-frame or a P-frame is encoded using the I-frame and the calculated motions of the macroblocks.

By processing video frames using CMOS chips coupled to memory dies, efficient parallel video encoding and decoding processes may be achieved by sharing computed data between the CMOS chips and decreasing duplicated computations. Furthermore, the calculation state parameters are completed by the CMOS chips coupled to the memory dies, which may allow for operation suspending and resuming without losing data or having to back up data.

In one embodiment, a solid state drive is disclosed that includes a memory device, a first CMOS coupled to the memory device, and a controller coupled to the memory device configured to execute computer-readable instructions. When executed, the computer-readable instructions cause the controller to receive at least a portion of one of a first I-frame comprising a first macroblock and second I-frame comprising a second macroblock, on the memory device and correlate a first macroblock to the second macroblock. The computer-readable instructions further cause the controller to determine a first motion vector of the first macroblock and a second motion vector of the second macroblock, and encode a P-frame based on one of the first I-frame and the first motion vector.

The instruction that causes the controller to correlate the first macroblock to the second macroblock is executed by the first CMOS. The first macroblock and second macroblock include an image. The solid state drive further includes computer-readable instructions to cause the controller to calculate a shift of position of the image as between the first macroblock and second macroblock based on one of the first motion vector and second motion vector. The solid state drive further includes a second CMOS. The computer-readable instructions that cause the controller to determine the first and second motion vectors further cause the first motion vector to be determined on the first CMOS, and the second motion vector to be determined on the second CMOS. The computer-readable instructions further cause the controller to encode a B-frame based on at least one of the first I-frame, second I-frame, and P-frame. The first CMOS includes an ECC engine. The computer-readable instructions further cause the controller to adjust one of a code rate or parity bits, based on one of the first I-frame, second I-frame, P-frame, and B-frame.

In another embodiment, a controller for a data storage device is disclosed that includes a memory comprising computer-readable instructions, and a processor configured to execute the computer-readable instructions that will cause the processor to store a portion of a first I-frame comprising a first macroblock on a jumbo block spanning multiple NAND dies, determine a motion vector of the first macroblock, and encode a P-frame based on the first I-frame and the first macroblock.

The computer-readable instructions further cause the processor to store a second I-frame comprising a second macroblock, and autocorrelate the first macroblock with the second macroblock. The computer-readable instructions further cause the processor to store the first macroblock and second macroblock on a NAND die. The computer-readable instructions further cause the processor to reorder the first macroblock and second macroblock to physically locate each on the NAND die, or duplicate information of the first macroblock and second macroblock and cause the duplicate information to be physically located on the NAND die. The computer-readable instructions further cause the processor to optimize ECC performance of a tunable ECC based on at least one of the first I-frame, second I-frame, and P-frame. The computer-readable instructions further cause the processor to optimize ECC performance of a tunable ECC based on a size of the motion vector. The computer-readable instructions further cause the processor to maintain a count of usage of one of the first I-frame, second I-frame, or P-frame, and optimize ECC performance of a tunable ECC based on the count.

In another embodiment, a data storage device is disclosed that includes a memory means configured to execute a method for video processing. The method includes receiving a first I-frame and a second I-frame at a plurality of CMOS CbAs, correlating the first I-frame and second I-frame to identify a first macroblock associated with the first I-frame and second macroblock associated with the second I-frame, the first macroblock correlated to the second macroblock, and calculating a first motion vector of the first macroblock and a second motion vector of the second macroblock.

The method further includes distributing one of the first motion vector and second motion vector between at least two CMOS CbAs of the plurality of CMOS CbAs. The data storage device further includes encoding one of a B-frame or a P-frame based on one of the first I-frame and the second I-frame. Each of the plurality of CMOS CbAs includes a tunable ECC. The method further includes tuning the tunable ECC of at least one of the plurality of CMOS CbAs based on one of the first I-frame and second I-frame. The method further includes further tuning the tunable ECC of at least one of the plurality of CMOS CbAs based on one of the first motion vector and second motion vector.

While the foregoing is directed to embodiments of the present disclosure, other and further embodiments of the disclosure may be devised without departing from the basic scope thereof, and the scope thereof is determined by the claims that follow.

What is claimed is:

1. A solid state drive, comprising:

a memory device;

a first complementary metal oxide semiconductor (CMOS) coupled to the memory device; and a controller coupled to the memory device, wherein the controller is separate and distinct from the first CMOS and memory device, wherein the first CMOS comprises one or more processors, memories, and an error correction code (ECC) engine, wherein the ECC engine includes a format check, a tunable ECC encoder, and a tunable ECC decoder, wherein the controller is configured to execute computer-readable instructions that when executed cause the controller to:

receive at least a portion of a first I-frame comprising a first macroblock and second I-frame comprising a second macroblock, on the memory device, wherein the memory device comprises a NAND die;

store the portion of the first I-frame with a first amount of error correction code (ECC) data;

correlate the first macroblock to the second macroblock;

determine a first motion vector of the first macroblock and a second motion vector of the second macroblock;

encode a P-frame based on the first I-frame and the first motion vector, wherein the encoding comprises encoding the P-frame with a second amount of ECC data, wherein the first amount of ECC data is greater than the second amount of ECC data; and either:

reorder the first macroblock and second macroblock to physically locate each on the NAND die; or duplicate information of the first macroblock and second macroblock and cause the duplicate information to be physically located on the NAND die.

2. The solid state drive of claim 1, wherein the instruction that causes the controller to correlate the first macroblock to the second macroblock is executed by the first CMOS.

3. The solid state drive of claim 2, wherein the first macroblock and second macroblock comprise an image, further comprising computer-readable instructions to cause the controller to calculate a shift of position of the image as between the first macroblock and second macroblock based on one of the first motion vector and second motion vector.

4. The solid state drive of claim 2, further comprising a second CMOS, wherein the computer-readable instructions that cause the controller to determine the first and second motion vectors, further cause the first motion vector to be determined on the first CMOS, and the second motion vector to be determined on the second CMOS.

5. The solid state drive of claim 4, wherein the computer-readable instructions further cause the controller to encode a B-frame based on at least the first I-frame, second I-frame, or P-frame.

6. The solid state drive of claim 1, wherein the computer-readable instructions further cause the controller to adjust one of a code rate or parity bits, based on the first I-frame, second I-frame, P-frame, or B-frame.

* * * * *